Jan. 30, 1973 HARUHIRO MATINO 3,713,910
METHOD FOR MANUFACTURING A SEMICONDUCTOR DEVICE
Filed Oct. 29, 1969
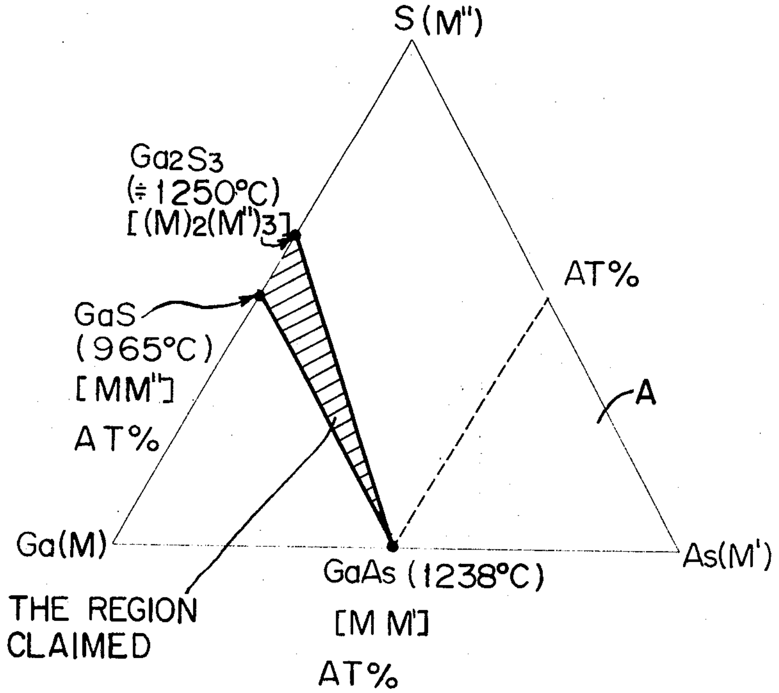
INVENTOR.
HARUHIRO MATINO
BY Irving M. Weiner
ATTORNEY United States Patent Office 3,713,910

Patented Jan. 30, 1973

3,713,910

METHOD FOR MANUFACTURING A SEMICONDUCTOR DEVICE

Haruhiro Matino, 1–18–6 Nishiogi Minami, Suginami-ku, Tokyo, Japan

Filed Oct. 29, 1969, Ser. No. 872,086
Claims priority, application Japan, Oct. 31, 1968, 43/78,902
Int. Cl. H01l 7/34
U.S. Cl. 148—1.5 6 Claims

ABSTRACT OF THE DISCLOSURE

A method for manufacturing a semiconductor device which, when the elements of Group VI such as sulphur (S) are diffused in a semiconductor formed of compounds of the elements of Groups III and V such as gallium arsenide (GaAs) to form a junction in said semiconductor, comprises preparing a dopant source from a composition consisting of such proportions of gallium, arsenic and sulphur as do not present a liquid phase during said diffusion process.

The present invention relates to a method for manufacturing a semiconductor device and more particularly to improvements in said method whereby there can be manufactured a desired semiconductor device by thermally diffusing sulphur or selenium in a semiconductor prepared from compounds of the elements of Groups III and V.

It is well known that there can be obtained a desired semiconductor device by diffusing a dopant made of the elements of Group VI such as sulphur or selenium in the prescribed plane of a semiconductor prepared from compounds of the elements of Groups II and V, such as gallium arsenide (GaAs), gallium phosphide (GaP), gallium antimonide (GaSb), aluminum arsenide (AlAs), aluminum phosphide (AlP), indium arsenide (InAs) and indium phosphide (InP). Said dopant diffusion is conducted in the following manner. For example, where there is diffused a dopant of S in a GaAs semiconductor, there are charged into a closed furnace a GaAs substrate and a small amount of a composition consisting of such proportions of S and As as fall within the region A of the appended triangular chart representing a Ga-As-S ternary system so as to diffuse S in the prescribed plane of said GaAs substrate, applying an elevated temperature of about 1000° C. However, the prior art thermal diffusion of such Ga-As-S ternary system had the drawback that the surface of a material subjected to said diffusion, for example, a Ga-As substrate was roughened, generally presenting difficulties in forming a diffusion junction with a smooth surface. Accordingly, at the PN junction prepared by the prior art thermal diffusion, there most likely occurred local insulation damage with the resultant decrease in the withstand voltage characteristics.

The present inventor has continued studies to cope with such difficulties and as a result has discovered that the phases in which said Ga-As-S ternary system for thermal diffusion can remain stable include a liquid phase in addition to solid and gas phases, the temperature rise or fall during thermal diffusion is accompanied with conversion from the solid or gas phase to the liquid phase, which leads to the occurrence of a roughened plane on the surface of a semiconductor substrate subjected to such diffusion, and consequently the selective use of a dopant source which will not present a liquid phase during said diffusion will resolve the above-mentioned problem of the roughened surface.

It is accordingly the object of the present invention to provide a method for easily manufacturing a semiconductor device having excellent withstand voltage characteristics which is always capable of forming a smooth junction surface in diffusing the elements of Group VI in a substrate prepared from compounds of the elements of Groups III and V.

When there is formed a junction in a semiconductor prepared from compounds of the elements of Groups III and V represented by the general formula MM′ (where M denotes the elements of Group III and M′ those of Group V) by thermally diffusing a dopant consisting of the element S, Se or Te in Group VI represented by the general formula M″, the present invention uses a solid dopant source composed of such proportions of M, M′ and M″ as will not present a liquid phase during diffusion. The present invention further comprises carrying out heat treatment of said dopant source at a temperature of less than its melting point to cause diffusion in said semiconductor.

The appended drawing is a triangular chart showing the proportions of elements involved in a ternary system used as a dopant source according to the present invention.

There will now be described the present invention by reference to the following example. Let us take the case, for example, where there is diffused by the closed tube method an N-type dopant of S in a P-type substrate of GaAs so as to form a PN junction. There is first prepared a P-type GaAs wafer whose surface is cleaned by ordinary means, such as washing with water or alcohol, lapping or etching, and coated with a film of $SiO_2$ or SiN, if required locally to restrict said diffusion. On the other hand, there is prepared a solid dopant source for diffusion from such proportions of Ga, As and S as fall within that region of the appended triangular chart representing a Ga-As-S ternary system indicated in an atomic percentage (AT%) which is defined by lines connecting GaAs, $Ga_2S_3$ and GaS. Using the general formulas, said proportions may be denoted as those chosen within the region defined by lines connecting MM′, $(M)_2(M'')_3$ and MM″ in a triangular chart of an M-M′-M″ ternary system. Referring to the aforesaid concrete example using a GaAs wafer, MM′ represents GaAs; $(M)_2(M'')_3$ represents $GaS_3$ because it means a molecule comprising two M elements and three M″ elements; and MM″ represents GaS. The aforesaid composition used as a dopant source is practically prepared by fully mixing, for example, 10 mg. of powdered GaAs, 10 mg. of powdered $Ga_2S_3$, and 10 mg. of powdered GaS. Thereafter, the GaAs wafer and solid dopant composition are introduced into a quartz tube, one end of which remains closed and the other end of which is sealed after said wafer and dopant composition are received. The quartz tube is heated 30 to 60 minutes while it is being evacuated to remove water and other impure gases contained in the GaAs wafer and quartz tube itself. When the quartz tube is evacuated to a degree of $10^{-3}$ to $10^{-5}$ mm. Hg, the other end of said tube which was left open up to this time is sealed. The sealed quartz tube is heated in a diffusion furnace customarily used in manufacturing a semiconductor device to carry out required thermal diffusion at a temperature of less than 965° C. The reason is that since GaS has a melting point of 965° C., application of a higher temperature than this level prevents said dopant source from retaining a solid phase. Practically, therefore, thermal diffusion is conducted one hour or more at a temperature of, for example, 930 to 940° C., and the GaAs wafer is taken out of the furnace upon completion of the diffusion of said dopant. Referring to the relationship between the depth of diffusion and the time requirement (at 930 to 940° C.) therefor associated with said GaAs wafer subjected to the diffusion of the dopant, the diffusion had a depth of about 0.4 micron for 1 hour and 1.6 microns for 16 hours. In either case, the diffused surface presented a smooth plane and a concentration of $10^{19}$/cm.$^{-3}$.

The manufacturing method of the present invention prevents the dopant composition from presenting a liquid phase during diffusion and saves the surface of a semiconductor from the so-called roughening, thus permitting the formation of a smooth junction. Further, the present invention enables the diffusion depth of a dopant and the depth of said junction to be suitably adjusted by changing the temperature and time of diffusion. Moreover, the invention eliminates particularly complicated manufacturing techniques and will consequently offer a broad field of application for a semiconductor prepared from compounds of the elements of Groups III and V.

Diffusion of sulphur in the GaAs substrate may also be made by the open tube method. Further, the wafer in which there is to be diffused a dopant may not only be of P-types but also of N and I types. In the latter cases, there are formed N-N and I-N type junctions. These various junctions are used in forming a diode and transistor. The semiconductor wafer in which there is to be diffused a dopant may be prepared not only from GaAs but also from any other compounds of Groups III and V such as GaSb, GaP, $GaAs_{1-x}Sb_x$, $GaAs_{1-x}P_x$, $InAs_{1-x}P_x$, AlAs, AlP, InAs and InP. Also, use of Se of Group VI as a diffusion dopant brings about the same effect as described above in connection with S of said group. For example, where Se is diffused in a GaP substrate, it is required to prepare a dopant composition from such proportions of Ga, P and Se as fall within the region defined by lines connecting GaP, $Ga_2Se_3$ and GaSe in a similar triangular chart representing a Ga-P-Se ternary system, and to perform heat treatment at a temperature lower than 960° C. because GaSe has a melting point of 960° C. This is also true with the diffusion of Se in an InP wafer. Namely, the dopant source is prepared from such proportions of In, P and Se as fall within the region defined by lines connecting InP, $In_2Se_3$ and InSe in a similar triangular chart representing an In-P-Se ternary system.

What is claimed is:

1. A method of manufacturing a semiconductor device which, when an element selected from the group consisting of sulfur and selenium in Group VI represented by the general formula M″ is diffused to form a junction in a semiconductor prepared from those compounds of an element selected from the group consisting of aluminum, gallium and indium in Group III and an element selected from the group consisting of phosphorus, arsenic and antimony in Group V, represented by the general formula MM′, where M denotes the elements of Group III and M′ those of Group V, is characterized by preparing a dopant source from such proportions of M, M′ and M″ as fall within the region defined by lines connecting MM′, $M_2M''_3$ and MM″ in a triangular chart representing an M-M′-M″ ternary system so as to prevent said dopant source from presenting a liquid phase during diffusion, and by heat treating said dopant source at a temperature lower than its melting point to cause diffusion in said semiconductor.

2. A method according to claim 1 wherein, when M″ consists of sulphur, said heat treatment is conducted at a lower temperature than 965° C.

3. A method according to claim 1 wherein, when M″ consists of selenium, said heat treatment is conducted at a lower temperature than 960° C.

4. A method according to claim 1 wherein, said dopant composition is prepared by mixing MM′, $M_2M''_3$ and MM″.

5. A method for manufacturing a semiconductor device of III–V group compounds which, when a dopant element selected from the group consisting of sulphur and selenium in Group VI represented by the general formula M″ is diffused into a semiconductor to form a junction therein, said semiconductor being prepared from compounds of an element selected from the group consisting of aluminum, gallium and indium in Group III and of an element selected from the group consisting of phosphorus, arsenic and antimony in Group V represented by the general formula MM′ where M denotes the elements of Group III and M′ denotes the elements of Group V, is characterized by preparing a dopant source from such proportions of M, M′ and M″ as fall within the region defined by lines connecting MM′, $M_2M''_3$ and MM″ in a triangular chart representing an M-M′-M″ ternary system so as to form a smooth junction in said semiconductor as a result of a diffusion of said dopant in solid phase which prevents a roughening of a surface of said semiconductor by heat treatment.

6. A method according to claim 5 wherein said semiconductor is of gallium arsenide and said dopant element is sulfur.

References Cited

UNITED STATES PATENTS

| | | | |
|---|---|---|---|
| 2,858,275 | 10/1958 | Folberth | 148—186 X |
| 3,070,467 | 12/1962 | Fuller et al. | 148—188 |

L. DEWAYNE RUTLEDGE, Primary Examiner

J. M. DAVIS, Assistant Examiner

U.S. Cl. X.R.

148—186, 188